United States Patent [19]

Takemura

[11] 4,442,532
[45] Apr. 10, 1984

[54] ENCODER OUTPUT PULSE DETECTION USING TWO STAGE SHIFT REGISTER AND CLOCK OSCILLATOR

[75] Inventor: Takehide Takemura, Hirakata, Japan

[73] Assignee: Matsushita Electric Industrial Co., Ltd., Kadoma, Japan

[21] Appl. No.: 265,323

[22] Filed: May 19, 1981

[51] Int. Cl.³ .................. H03K 13/02; G01G 3/00; G01R 19/14

[52] U.S. Cl. .................. 377/3; 340/347 P; 377/54; 377/64; 377/73; 377/81; 328/109; 328/133; 324/83 R; 307/515

[58] Field of Search ............ 235/92 P, 92 B, 92 PS, 235/92 TF, 92 FQ, 92 SH; 328/37, 55, 57, 62, 109, 110, 155, 34, 28–29, 118, 133; 324/83 R, 83 D, 82, 78 D, 86, 160–167, 86 Q; 307/515, 514, 510, 519, 525–529, 512; 377/43, 54, 73, 81, 64; 364/565; 340/347 P

[56] References Cited

U.S. PATENT DOCUMENTS

| | | | |
|---|---|---|---|
| 4,041,483 | 8/1977 | Groff | 340/347 P |
| 4,047,007 | 9/1977 | Dlugos et al. | 235/151.33 |
| 4,157,507 | 6/1979 | Desai et al. | 328/134 |
| 4,245,322 | 1/1981 | Batchelor | 364/565 |
| 4,266,215 | 5/1981 | Adams | 340/347 P |
| 4,308,500 | 12/1981 | Avins | 328/133 |

Primary Examiner—James D. Thomas
Assistant Examiner—Archie E. Williams, Jr.
Attorney, Agent, or Firm—Cushman, Darby & Cushman

[57] ABSTRACT

A pulse detection circuit, is used for detecting pulses contained in output signals derived from an encoder. An encoder, such as rotary encoder, converts a physical quantity like spatial position, displacement or length into an electric signal. This detection circuit achieves high definition in terms of the rotational angle of the encoder shaft. It does so by positively utilizing four different combinations of modes, obtained for one period of the encoder output signals, which had hitherto been treated in one count. It thereby avoids erroneous counting of the pulses contained in the encoder output signals, even if chatterings are incidentally included in the encoder output signals and if the phase relation between the two signals is temporarily inverted. The circuit thus performs pulse detection with a very high accuracy.

2 Claims, 14 Drawing Figures

ENCODER OUTPUT PULSE DETECTION USING TWO STAGE SHIFT REGISTER AND CLOCK OSCILLATOR

BACKGROUND OF THE INVENTION

1. Field of the Invention

The present invention generally relates to a pulse detection technique. Particularly, it is concerned with a pulse detection circuit for detecting pulses contained in output signals derived from an encoder such as a rotary encoder which coverts any physical quantity like spatial position, displacement or length into an electric signal.

2. Description of the Prior Art

In general, a rotary encoder is used to generate output signals A and B of different phase simultaneously in response to the rotation of a shaft 2, being projected from a body 1 thereof as shown by FIG. 1. Numbers of the output pulses of the signals A and B issued from the terminals 3 and 4 of the encoder, respectively, correspond to the rotational angle of the shaft 2, which is then detected by counting the pulses contained in the output signals A and B. In FIG. 1, numeral 5 represent a common terminal. It is needless to say that the larger the number of pulses per rotation of the shaft 2 contained in the output signal of the rotary encoder, the higher the accuracy of the detection of the rotational angle of the shaft 2 will be.

Namely, any physical quantity is converted into a rotational motion of the shaft 2 of the rotary encoder, which can convert a change in the physical quantity into a change in an electric signal, usually a digital data composed of the pulses. And by counting these pulses by a counter composed of an IC, an accurate measurement of the physical quantity can be made in an easy and simple manner.

Incidentally, the output signals A and B, derived from the rotary encoder, are usually designed to have pulse sequences of phases being shifted with each other as shown in FIG. 2. By detecting this phase shift, the rotary encoder shown in FIG. 1 can discriminate the rotational direction of the shaft 2 based on a relative phase difference, whether it rotates clockwisely or anticlockwisely. As a pulse detection circuit for detecting the phase shift between the pulses contained in both of the encoder output signals to discriminate the rotational direction, and for generating a control signal, the following circuits have hitherto been known to the art.

One example of such a conventional circuit includes the use of an up-down counter 6 shown in FIG. 3, wherein one of the encoder output signals is fed to the clock input terminal CP and the other is fed to the up-down input terminal UP/DOWN of the up-down counter 6, respectively. According to this arrangement, the up-down counter 6 counts the rise-up edge of the pulse contained in the encoder output signal A, which is fed to the clock input terminal CP. Hence the up-down counter assumes an "up" state in response to one level, for instance, a high level (hereinafter, simply referred to as "H" level) of the encoder output signal B, which is fed to the up-down input terminal UP/DOWN, while it assumes its "down" state in response to an opposite level, i.e., a low level ("L" level).

As indicated above, if the encoder output signals A and B are fed to the clock input terminal CP and the up-down input terminal UP/DOWN of the up-down counter 6, respectively, the counter 6 counts downwardly by the clockwise rotation of the encoder shaft and counts upwards by the anticlockwise rotation shown in FIG. 2, discriminatively. The cumulated count value of this up-down counter indicates the rotational direction and angle of the encoder shaft.

Another example of the conventional measure includes the use of a logic circuit composed of an exclusive OR gate 9, three AND gates 10, 11 and 12, and an inverter 13, shown in FIG. 4. In this logic circuit, the rise-up edge of the pulse contained in the encoder output signal A is detected by the exclusive OR gate 9 in combination with the AND gate 10 to generate a pulse signal at the output terminal of the AND gate, which output signal is fed to the one input terminals of the AND gates 11 and 12. This output signal therefore causes either of the AND gates 11 and 12 to issue a pulse signal, on the basis of the level in the encoder output signal B at each time when the rise-up edge of the signal A is detected. Namely, a pulse signal is issued from the AND gate 11, if the encoder output signal B is in its "H" level, whereas the pulse signal is issued from the AND gate 12, if the signal B is in its "L" level. An output terminal 7 of this logic circuit therefore issues an output signal if the encoder shaft rotate anti-clockwisely and another output terminal 8 issues an output signal if the encoder shaft rotate clockwisely.

These output signals are then counted by a conventional counter to give a desired control signal.

Two major disadvantages are, however, inherent to those conventional arrangements, and will be described below.

One of the major disadvantages is a liability of causing an erroneous counting. In general, the encoder as shown in FIG. 1 may be embodied in an optical or mechanical contact system, from which an output signal in an ideal rectangular waveform as depicted in FIG. 2 cannot usually be obtained. On the contrary, it cannot avoid an incident of a chattering sudden burst of noise (chattering noise) at or adjacent to rise-up or fall-down edge of the pulse contained in its output signal because of the instability or the like in the contacts at the times of its closing or opening. If the chattering noise occurs, erroneously many numbers of pulses would be contained in the encoder output signal, which is to be received by, for instance, the clock input terminal CP of the up-down counter shown in FIG. 3 to cause a count value higher than the actual count.

In order to prevent such an erroneous count due to the chattering, use of a low pass filter (LPF) comprising an integral circuit composed of a capacitor and a resister has hitherto been proposed. The encoder output signal is fed to the detection circuit through the LPF. In a case wherein, the period of the encoder output signal is approximately constant, in the other words, the rotational frequency of the shaft 2 is constant, the above-mentioned means of using a LPF is fairly effective, because the time period during which the chattering occurs (chattering time) is almost constant. However, the length of the chattering time generally depends on the length of the period or pulse duration of the encoder output signal, and hence is usually varying. Therefore, if the LPF is adjusted to be effective for an encoder output signal in a state of long period (corresponding to a low rotational frequency of the shaft) by enlarging the time constant of the integral circuit, the response of the detecting circuit will become insufficient when the period is shortened and the circuit itself will be unable to count the pulse properly. Conversely, if the LPF is adjusted to be effective for an encoder output signal in a state of short period (a high rotational frequency), the possibility of the detecting circuit commiting an erroneous counting will be made greater when the period is elongated, because the LPF cannot absorb the chattering.

Another major disadvantage of the conventional technique is in a possibility of commiting an erroneous counting at a time of changing the rotational direction of the encoder shaft. This will be elucidated in detail by referring to FIG. 5, wherein the pulse sequences in the encoder output signals A and B are represented by waveforms with respect to relation angles in the first and second lines respectively, while the third line schematically indicates the example of changings of rotational direction of the encoder. When the shaft of the encoder rotates in the direction indicated by arrows, the circuit counts up at point 14 and 15 which correspond to a rise-up edges of the pulses contained in the encoder output signal A. Next, if the rotational direction of the shaft is changed immediately after passing point 15, the circuit counts down not at point 15' but at point 16 which corresponds to a rise-up edge with respect to the leftward direction of the pulse contained in the encoder output signal A. Thereof as indicated above, an error represented by "m" in FIG. 5 which is a distance from point 15' to point 16 occurs during the while the detecting circuit counts up at the point 15 and counts down at the point 16 after the change in the rotational direction. Furthermore, if the rotational direction is changed again before passing the point 16 as indicated by an arrow along a broken line in FIG. 5, the detecting circuit counts up again at a point 17 and returning rotation is not represented by the output. Therefore, if such motion of broken line arrows are repeated, a cumlative error value will be greater.

SUMMARY OF THE INVENTION

It is therefore the primary object of the present invention to provide a pulse detection circuit which obviates the disadvantages inherent to those conventional arrangements.

It is another object of the present invention to provide a pulse detection circuit which will not commit an erroneous counting of pulses contained in the encoder output signals even if chatterings are incidentally contained in the encoder output signals and if the phase relation between the two signals is temporarily reversed, to perform the pulse detection in a very high accuracy.

It is still another object of the present invention to provide a pulse detection circuit of high definition, which counts four different combinations of modes obtained for one period (T in FIG. 2) of the encoder output signals which had hitherto been treated in one count.

According to the present invention there is provided a pulse detection circuit which comprises; a first and a second input terminals, each for receiving either one of encoder output signals containing a succession of pulses being shifted in phase with each other; a first and a second rise-up detectors for detecting the rise-up edges of the pulses being fed to said first and second input terminals; a first and a second fall-down detectors for detecting the fall-down edges of said pulses; a first gate circuit composed of AND gates, each for obtaining a logical product of the output of either one of said first rise-up and fall-down detectors and the signal level at said second input terminal, or a logical product of the output of either one of said second rise-up and fall-down detectors and the signal level at said first input terminal; and a second gate circuit composed of OR gates, each for obtaining a logical sum of the logical products obtained by said AND gates in said first gate circuit.

The second gate circuit may comprise a first OR gate which issues a logical sum of the outputs of the AND gates representing a clockwise rotation of the encoder shaft, and a second OR gate which issues a logical sum of the outputs of the AND gates representing an anticlockwise rotation of the encoder shaft.

Each combination of said first rise-up and fall-down detectors, and of said second rise-up and fall-down detectors, may be constituted by a gate circuit including a time-delaying element or elements. It may alternatively be constituted by a two-stage shift register, a clock oscillator which feeds a clock pulse to said shift-register, and a gate circuit which receives the outputs of said shift-register. The output terminals of said gate circuit may be connected to an RS-flip-flop which is adjusted to be reset by said clock pulse.

DESCRIPTION OF THE PREFERRED EMBODIMENT

Figure 1:
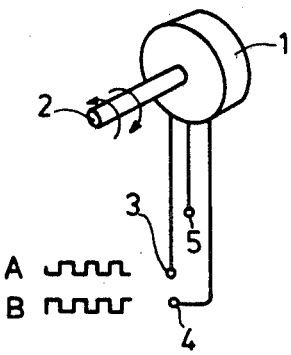
FIG. 1 is a schematic view elucidating a performance of a rotary encoder in general use.
Figure 2:
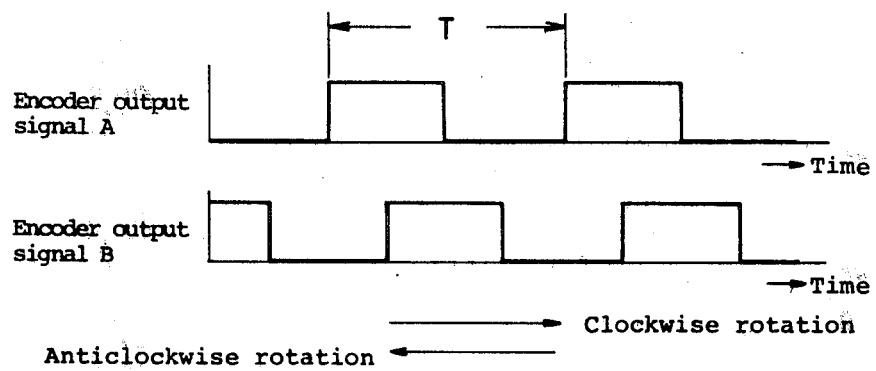
FIG. 2 is waveform diagrams of the output signal derived from said encoder.
Figure 3:
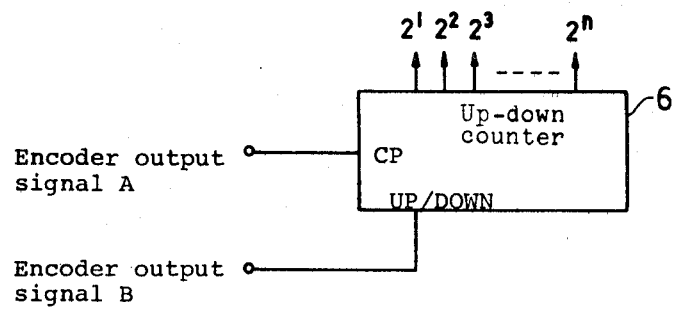
FIG. 3 is a circuit diagram showing a conventional pulse detection circuit.
Figure 4:
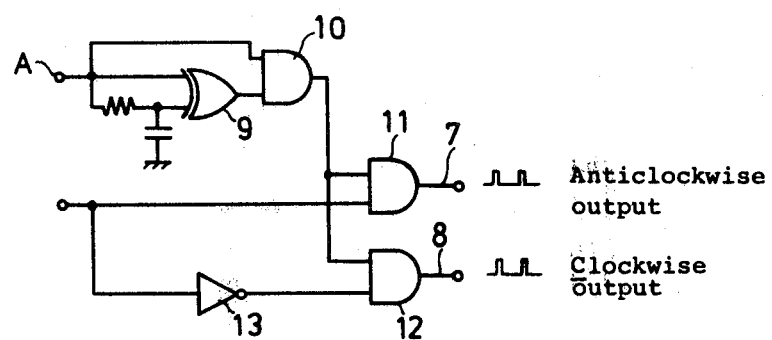
FIG. 4 is a circuit diagram showing another conventional pulse detection circuit.
Figure 5:
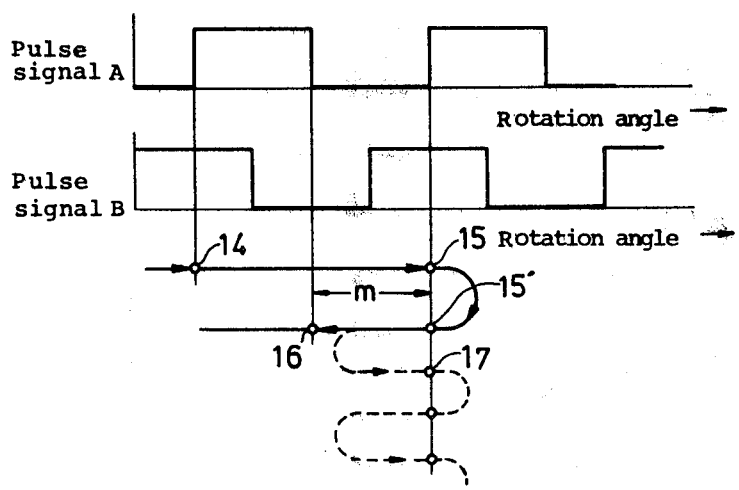
FIG. 5 is a schematic view for illustrating the disadvantages of the circuit shown in FIG. 4.
Figure 6:
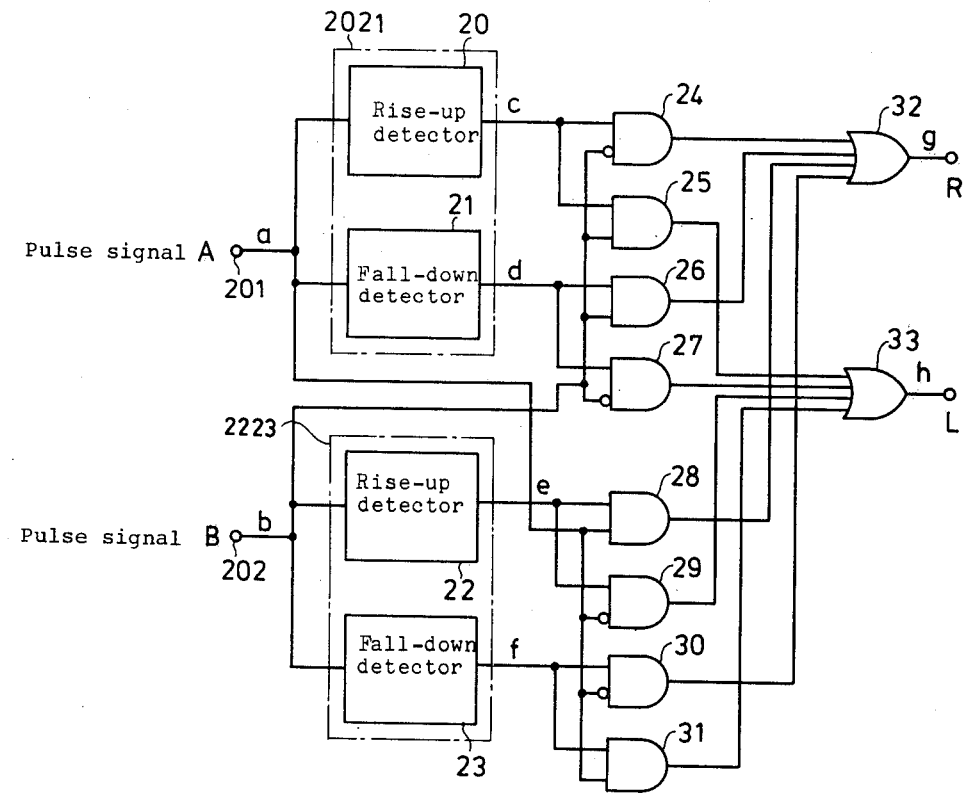
FIG. 6 is a circuit diagram showing a fundamental arrangement of the pulse detection circuit embodying the present invention.

In the fundamental arrangement of the pulse detection circuit of the present invention shown in FIG. 6, the rise-up/fall-down edges of the pulses contained in the encoder output signals A and B are positively utilized.

The modes of the encoder output signals A and B are summarized in the following table by classifying them into the rotation of the encoder shaft in clockwise direction and anti-clockwise direction.

| Direction of rotation | Output signal appeared at AND gate of (in FIG. 6) | Encoder output signal | |
| --- | --- | --- | --- |
| Clockwise | | | |
| R-1 | 24 | A (↗) (Rise-up at the signal A) | B (L) ("L" level of the signal B) |
| R-2 | 28 | B (↗) (Rise-up at the signal B) | A (H) ("H" level of the signal A) |
| R-3 | 26 | A (↘) (Fall-down at the signal A) | B (H) ("H" level of the signal B) |
| R-4 | 30 | B (↘) (Fall-down at the signal B) | A (L) ("L" level of the signal B) |
| Anticlockwise | | | |
| L-1 | 29 | B (↗) | A (L) |
| L-2 | 25 | A (↗) | B (H) |
| L-3 | 31 | B (↘) | A (H) |
| L-4 | 27 | A (↘) | B (L) |

As can be seen from the above table, there is no identical combination of modes between the encoder output signals A and B in the clockwise and anticlockwise rotations of the encoder shaft and the discrimination of the rotational directions can easily be made by positively utilizing the combinations. Therefore, the present invention utilizes the four combinations of the modes obtained for one period of the signals A and B.

In the fundamental arrangement of the present invention shown in FIG. 6, numerals 20 and 22 represent rise-up detectors for detecting the rise-up edges of the pulses contained in the encoder output signals A and B, respectively; numerals 21 and 23 represent fall-down detectors for detecting the fall-down edges of the pulses contained in the encoder output signals A and B, respectively; numerals 24, 25, 26, 27, 28, 29, 30 and 31, each represents an AND gate; and numerals 32 and 33, each represents an OR gate.

As listed in the above table, the AND gates 24-31 issue output signals corresponding to the modes R-1-R-4 and L-1-L-4, respectively.

In accordance with these output signals of the AND gates 24-31, an output pulse, which corresponds to the clockwise rotation of the shaft, is issued from the output terminal R of the OR gate 32, and another output pulse, which corresponds to the anticlockwise rotation of the shaft, is issued from the output terminal L of the OR gate 33.

Figure 7:
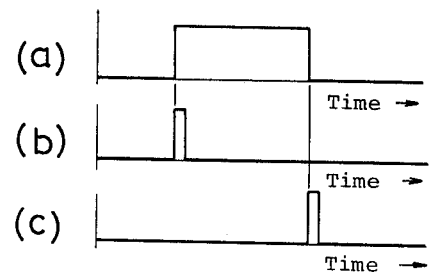
FIGS. 7(a), 7(b) and 7(c) are timing charts for elucidating the performance of a rise-up/fall-down detectors in the circuit shown in FIG. 6.

The rise-up edge detectors 20 and 22 and the fall-down edge detectors 21 and 23 perform a function as shown in timing charts in FIGS. 7(a), 7(b) and 7(c), wherein the encoder output signal A is exclusively taken as an example. Namely, when a signal A shown in FIG. 7(a) is fed to the input terminal 201, a positive pulse as shown in FIG. 7(b) is issued from the rise-up edge detector 20 while a positive pulse as shown in FIG. 7(c) is issued from the fall-down edge detector 21. By the way, it is to be noted that in the pulse detection circuit of the present invention, the above-mentioned operation is applicable irrespective of polarity of the pulse. That is, a negative pulse can equally be treated by simply reversing the logic of the circuit.

The performance of the circuit shown in FIG. 6 will be elucidated below by referring to the timing charts shown in FIGS. 8(a)-8(h), wherein each of the timing charts indicated by (a), (b), (c), (d), (e), (f), (g) and (h) corresponds to each of the signals appearing at the points a, b, c, d, e, f, g and h of FIG. 6.

Figure 8:
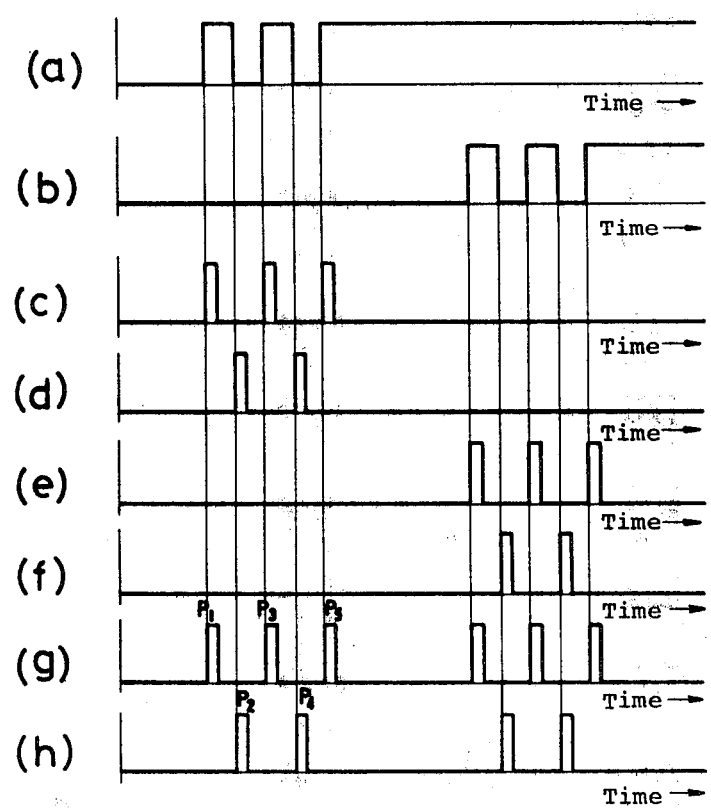
FIG. 8 is a set of timing charts representing signals appearing at various parts of the circuit shown in FIG. 6.

When the encoder output signals A and B, each of which contains chattering noises as indicated by the timing charts (a) and (b) in FIG. 8, are fed to the input terminals 201 and 202, respectively, the rise-up detectors 20 and 22 generate pulse signals in response to the rise-up edges of the pulse contained in the encoder output signal as indicated by the timing charts (c) and (e) in FIG. 8, while the fall-down detectors 21 and 23 generate pulse signals in response to the fall-down edges of the pulse contained in the encoder output signal as indicated by the timing charts (e) and (f) in FIG. 8. In the results, the pulse signals as indicated by the timing charts (g) and (h) in FIG. 8 are obtained from the output terminals R and L of the OR gates 32 and 33.

When it is set that the output terminal R being positive and the output terminal L being negative, the pulse $P_1$ is counted as $+1$ but is cancelled by $-1$ corresponding to the subsequent pulse $P_2$ to make the count value 0. Similarly, the count value becomes $+1$ by the pulse $P_3$ but turns to 0 again by the pulse $P_4$ and then becomes $+1$ by the pulse $P_5$.

As elucidated above, even if the encoder output signals A and B contain any numbers of chattering noise, an erroneous counting due to the chattering noise can effectively be prevented.

FIGS. 9 through 14 inclusive show concrete circuit arrangements of the rise-up/fall-down detectors which may be included in the pulse detection circuit embodying the present invention and, will be elucidated in detail below.

Figure 9:
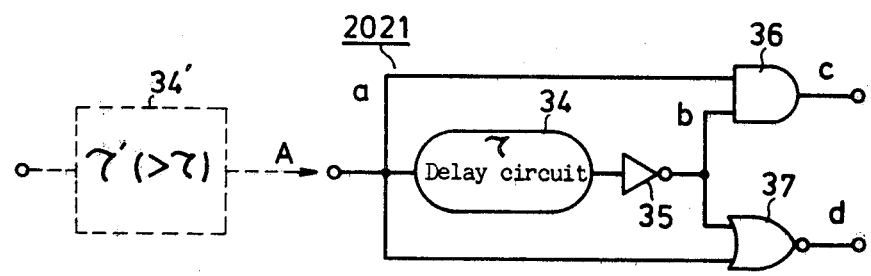
FIG. 9 is a circuit diagram showing a concrete embodiment of the rise-up/fall-down detector in the pulse detection circuit embodying the present invention.
Figure 10:
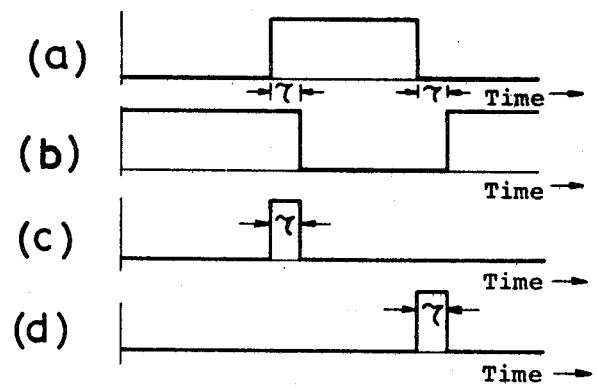
FIG. 10 is a set of timing charts representing signals appearing at various parts of the circuit shown in FIG. 9.

An embodiment shown in FIG. 9 comprises a delay circuit 34 having a delay time $\tau$, an inverter 35, an AND gate 36 and a NOR gate 37. In FIG. 10, there are shown timing charts of the signals appearing at various parts of the circuit shown in FIG. 9. The timing charts (a), (b), (c) and (d) of FIG. 10 correspond to the signals at a, b, c and d of FIG. 9.

Namely, when an encoder output signal as shown by the timing chart (a) is fed to the input terminal of the circuit, an inversed signal with a delay by $\tau$ as shown by the timing chart (b) is issued from the inverter 35, thereby a signal including a pulse of the duration $\tau$ as shown by the timing chart (c) is obtained from the AND gate 36 in response to the rise-up edge of the pulse contained in the encoder output signal (a), while a signal including a pulse of the duration $\tau$ as shown by the timing chart (d) is obtained from the NOR gate 37 in response to the fall-down edge. The delay circuit may be embodied simply by a resistor and a capacitor.

The illustrated (in solid lines) circuit might sometimes be unsatisfactory, because it could not respond to an input pulse of a width shorter than τ and may cause an erroneous operation due to the difference in threshold levels of each gates in response to an input pulse of a width which approximates to τ. In order to prevent such a drawback by cancelling input pulses shorter than τ, a delay circuit 34' of delay time larger than τ may additionally be provided in the preceding stage of the circuit as shown by broken line in FIG. 9.

Figure 11:
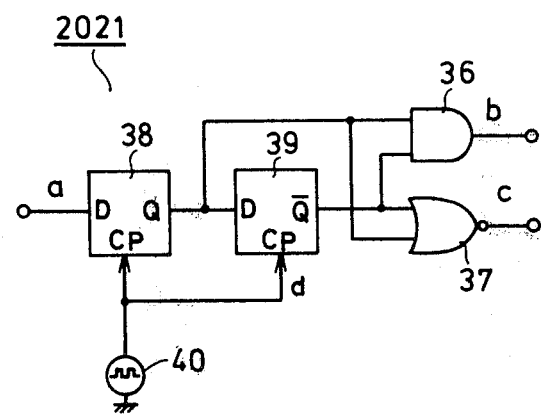
FIG. 11 is a circuit diagram showing another concrete embodiment of the rise-up/fall-down detector in the pulse detection circuit embodying the present invention.

Another embodiment shown in FIG. 11 comprises a two-stage shift register composed of two D-flip-flops 38 and 39, an AND gate 36, a NOR gate 37 and a clock oscillator 40. The output signals Q and $\bar{Q}$ are fed to the AND gate 36 and the NOR gate 37. The output signal $\bar{Q}$ derived from the D-flip-flop 39 is an inverted output signal Q from the D-flip-flop 38 with a delay as long as one period in the clock pulse of the clock oscillator 40. The signal processing by this circuit, other than specifically indicated above, is identical with that shown in FIG. 9.

Figure 12:
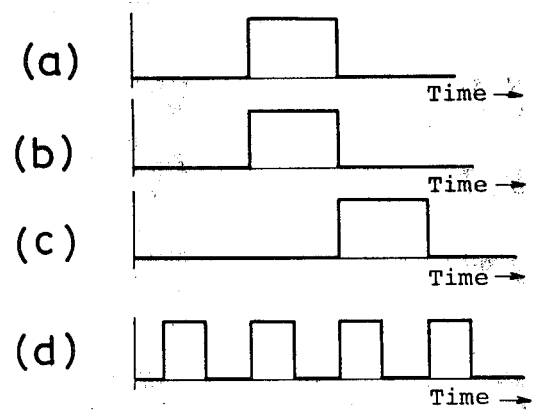
FIG. 12 is a set of timing charts representing signals appearing at various parts of the circuit shown in FIG. 11.
Figure 13:
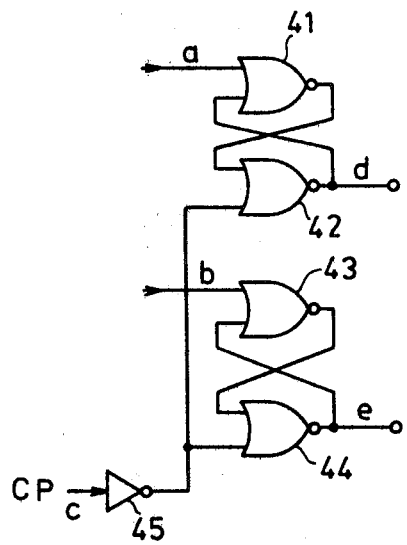
FIG. 13 is a circuit diagram of a partial circuit which may be employed together with the circuit shown in FIG. 11.

In the embodiment shown in FIG. 11, if an input signal containing pulses the duration of which approximates to the period of the clock pulse is fed to the circuit, an erroneous counting may result therefrom because the output signal from the AND gate 36 is closely followed by that from the NOR gate 37 to make the fall-down edge of the former coincide with the rise-up edge of the latter as shown in FIG. 12. In FIG. 12, the timing chart (a) represents an input signal appearing at a in FIG. 11, that (b) represents an output signal of the AND gate 36 appearing at b in FIG. 11, that (c) represents an output signal of the NOR gate 37 appearing at c in FIG. 11, and that (d) represents a clock signal appearing at d in FIG. 12, respectively.

Figure 14:
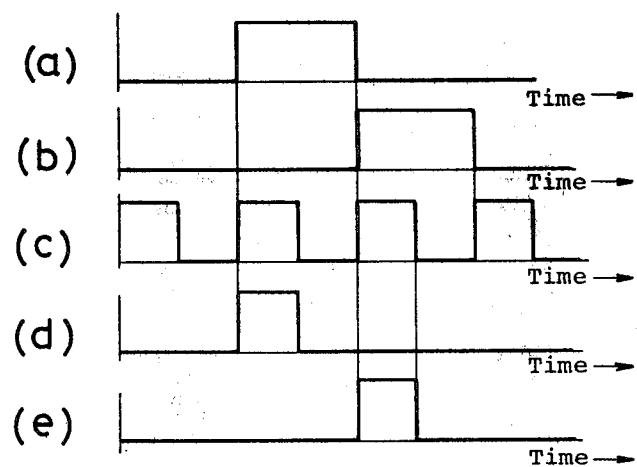
FIG. 14 is a set of timing charts representing signals appearing at various points of the circuit shown in FIG. 13.

The above-mentioned erroneous counting can be prevented by providing an additional circuit for processing the outputs of the circuit shown in FIG. 11. The additional circuit may be embodied as FIG. 13, wherein a RS-flip-flop, comprising four NOR gates 41, 42, 43 and 44 and an inverter 45, is connected to the output terminals of the AND gate 36 and NOR gate 37 respectively and is designed to be reset at the fall-down edge of the clock pulse CP (from the clock oscillator shown in FIG. 11). In FIG. 14, a timing chart (a) represents an input signal appearing at a, the input terminal of the NOR gate 41, of FIG. 13, that (b) represents an input signal appearing at b, the input terminal of the NOR gate 43 of FIG. 13, that (c) represents a clock pulse CP, that (d) represents an output signal appearing at d, the output terminal of the NOR gate 42 of FIG. 13, and that (e) represents an output signal appearing at e, the output terminal of the NOR gate 44, respectively.

What is claimed is:

1. A pulse detection circuit for detecting output signals of an encoder, which comprises:

a first and a second input terminals, each for receiving either one of said encoder output signals containing two successions of pulses being shifted in phase with each other;

a first and a second rise-up detectors for detecting the rise-up edges of the pulses being fed to said first and second input terminals;

a first and a second fall-down detectors for detecting the fall-down edges of said pulses;

a first gate circuit composed of AND gates, each for obtaining a logical product of the output of either one of said first rise-up and fall-down detectors and the signal level at said second input terminal, or for obtaining a logical product of the output of either one of said second rise-up and fall-down detectors and the signal level at said first input terminal; and a second gate circuit composed of OR gates each for obtaining a logical sum of the logical products obtained by said AND gates in said first gate circuit, said second gate circuit comprising a first OR gate which issues a logical sum of the outputs of a part of said AND gates, representing a clockwise rotation of the encoder shaft, and a second OR gate which issues a logical sum of the outputs of a part of the AND gates representing an anti-clockwise rotation of the encoder shaft, and each combination of said first rise-up and fall-down detectors, and of second rise-up and fall-down detectors being constituted by a two stage shift-register, a clock oscillator which feeds a clock pulse to said shift-register, a third gate circuit which receives the outputs of said shift-register and an RS-flip-flop, output terminals of said third gate circuit being connected to said RS-flip-flop which is adjusted to be reset by said clock pulse.

2. A pulse detection circuit as claimed in claim 1, wherein each combination of said first rise-up and fall-down detectors, and of said second rise-up and fall-down detectors, is constituted by a gate circuit including a time-delaying element or elements.

* * * * *